United States Patent
Ehwald et al.

(10) Patent No.: US 7,304,348 B2
(45) Date of Patent: Dec. 4, 2007

(54) DMOS TRANSISTOR

(75) Inventors: Karl-Ernst Ehwald, Frankfurt (DE); Holger Rücker, Bad Saarow (DE); Bernd Heinemann, Frankfurt (DE)

(73) Assignee: IHP GmbH - Innovations for High Performance Microelectronics/Institut fur Innovative Mikroelektronik, Frankfurt (DE)

( * ) Notice: Subject to any disclaimer, the term of this patent is extended or adjusted under 35 U.S.C. 154(b) by 0 days.

(21) Appl. No.: 10/487,174
(22) PCT Filed: Aug. 16, 2002
(86) PCT No.: PCT/EP02/09184

§ 371 (c)(1),
(2), (4) Date: Aug. 16, 2004

(87) PCT Pub. No.: WO03/017349

PCT Pub. Date: Feb. 27, 2003

(65) Prior Publication Data

US 2004/0262680 A1    Dec. 30, 2004

(30) Foreign Application Priority Data

Aug. 17, 2001 (DE) ............... 101 40 628
Sep. 7, 2001 (DE) ............... 101 45 212

(51) Int. Cl.
*H01L 29/94* (2006.01)
*H01L 21/336* (2006.01)

(52) U.S. Cl. ............ 257/335; 257/328; 257/336; 257/338; 257/E39.016; 257/E39.019; 257/E39.02

(58) Field of Classification Search ........ 252/335, 252/336, 338, 339, 341, 342, 347
See application file for complete search history.

(56) References Cited

U.S. PATENT DOCUMENTS 4,811,075 A    3/1989    Eklund (Continued)

FOREIGN PATENT DOCUMENTS

DE    43 36 054 A1    4/1995

(Continued)

OTHER PUBLICATIONS

High Performance RF LDMOS Transistors with 5nm Gate Oxide in a 0.25um SiGe;C BiCMOS Technology; K. Ehwald, et al; IHP, Im Technologiepark 25, 15236 Frankfurt, Germany, (Publication date to be supplied).

*Primary Examiner*—Sue A. Purvis
*Assistant Examiner*—Fazli Erdem
(74) *Attorney, Agent, or Firm*—Ware, Fressola, Van Der Sluys & Adolphson LLP

(57) ABSTRACT

A lateral CMOS-compatible RF-DMOS transistor (RFLDMOST) with low 'on' resistance, characterised in that disposed in the region of the drift space (20) which is between the highly doped drain region (5) and the control gate (9) and above the low doped drain region LDDR (22, 26) of the transistor is a doping zone (24) which is shallow in comparison with the penetration depth of the source/drain region (3, 5), of inverted conductivity type to the LDDR (22, 26) (hereinafter referred to as the inversion zone) which has a surface area-related nett doping which is lower than the nett doping of the LDDR (22, 26) and does not exceed a nett doping of 8E12 At/cm2.

13 Claims, 1 Drawing Sheet

U.S. PATENT DOCUMENTS

| | | | |
|---|---|---|---|
| 5,264,719 A * | 11/1993 | Beasom | 257/335 |
| 5,311,051 A | 5/1994 | Tukizi | |
| 5,763,927 A | 6/1998 | Koishikawa | |
| 6,664,596 B2 * | 12/2003 | Cai et al. | 257/343 |

FOREIGN PATENT DOCUMENTS

| | | |
|---|---|---|
| DE | 100 04 387 A 1 | 11/2001 |
| DE | 100 63 135 A 1 | 10/2002 |
| EP | 55108773 | 8/1980 |
| EP | 60177677 | 9/1985 |
| EP | 0 295 391 | 12/1988 |
| EP | 04107871 | 4/1992 |
| EP | 2001015741 | 1/2001 |
| WO | WO 01/75979 A 1 | 10/2001 |

* cited by examiner

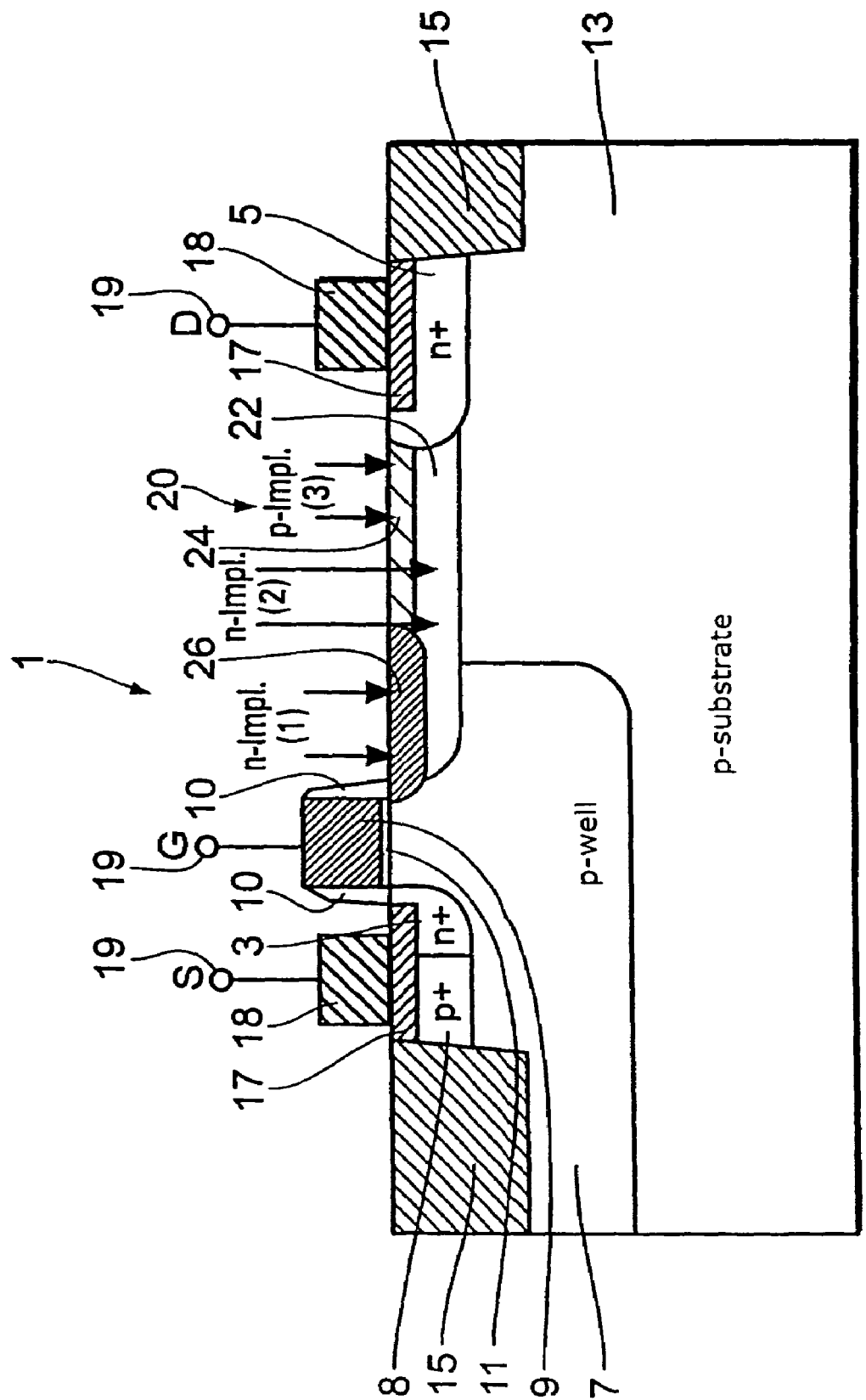

DMOS TRANSISTOR

CROSS REFERENCE TO RELATED APPLICATIONS

This application is for entry into the U.S. national phase under §371 for International Application No. PCT/EP02/09184 having an international filing date of Aug. 16, 2002, and from which priority is claimed under all applicable sections of Title 35 of the United States Code including, but not limited to, Sections 120, 363 and 365(c), and which in turn claims priority under 35 USC §119 to German Patent Application No. 101 45 212.8 filed on Sep. 7, 2001, and German Patent Application No. 101 40 628.2 filed on Aug. 17, 2001.

TECHNICAL FIELD

The invention concerns a lateral DMOS transistor, referred to for brevity as an LD-MOS transistor, in particular a CMOS-compatible RF-LDMOS transistor with a low 'on' resistance, and a process for the production thereof.

BACKGROUND ART

A DMOS transistor is distinguished over a conventional MOS transistor (metal oxide semiconductor transistor) in that provided between the edge of the control gate and the drain region of the transistor is a drift zone, that is to say a zone in which the motion of the charge carriers is produced only by an electrical field applied between the oppositely disposed ends of the zone. In a lateral DMOS transistor (LDMOS transistor) the drift zone extends in the lateral direction, between the edge of the control gate and the drain region spaced therefrom in the lateral direction.

LDMOS transistors are used as high voltage components in which voltages, so-called drain voltages, of more than 100 volts, can be applied between the drain region and the source region of the LDMOS transistor. In addition LDMOS transistors are also used as high frequency power amplifiers with drain voltages in the range of between 10 volts and 20 volts as the operating voltage of the high frequency power amplifier.

Disposed in the drift zone of the LDMOS transistor is a weakly doped drain region which is near the surface, referred to for brevity as the LDD region (low doped drain region), which extends between the edge of the control gate and the drain region and which involves the same charge carriers as the drain region.

In the LDD region and the region below the control gate in which there is a highly doped region, referred to for brevity as the well, the flow of current is based in each case on different charge carriers. Thus in the LDD region the charge carriers are electrons while in the well they are holes or vice-versa. Therefore the LDD region and the well form a diode. Usually the well shares an external terminal with the source region so that the two are at the same potential. The LDD region is contacted by way of the drain region so that the drain voltage is applied at the end thereof that is towards the drain. If there is an open circuit in respect of the 'diode', that is to say a voltage is not present either at the control gate or at the LDD region (the voltage of the control gate, like the drain voltage, is measured with respect to the potential of the source region), then no voltage is dropped across the 'diode' consisting of the well and the LDD region, and a zone which is depleted in respect of charge carriers, the depletion zone, is formed at the junction from the well to the LDD region. A voltage drop occurs across the depletion zone and that has the result that the depletion zone remains limited to the region in the proximity of the junction. If now a drain voltage is applied the voltage drop across the depletion zone is increased. By virtue of the high drain voltages in LDMOS transistors high voltage drops occur in the depletion zone. Free charge carriers are produced in small amounts in the depletion zone by thermal excitation. If the voltage drops become too high the thermally excited free charge carriers are accelerated by the voltage drop in the depletion zone in such a way that, by virtue of colliding with atoms, they can break up the covalent bonds thereof. That produces new free charge carriers which in turn can break up covalent bonds and so forth. That results in what is known as an avalanche breakdown at the junction.

The described avalanche breakdown can have the result that high-energy charge carriers, so-called hot charge carriers, penetrate into the oxide layer between the well and the control gate (that oxide layer is referred to as the gate oxide). Those charge carriers are held fast in the gate oxide, which in time results in static charging of the gate oxide and thus impairs the properties of the LDMOS transistor. Likewise hot charge carriers penetrate into an oxide layer or nitride layer over the LDD region and are held fast there. This also results in static charging of the corresponding layer. Such charging in worst case scenarios can lead to a great reduction in or complete suppression of the flow of current through the DMOS transistor.

In addition the control gate and the gate-side edge of the LDD region, between which there is a part of the gate oxide layer, form a capacitor. With a high drain voltage a high voltage drop occurs across that capacitor, and that voltage drop can have the result that charge carriers accelerated by the voltage drop break through the oxide layer. That is then referred to as insulator breakdown.

One approach for overcoming the above-outlined disadvantages involves reducing the charge carrier concentration in the part of the LDD region in which there is a junction to the highly doped region beneath the control gate, to such an extent that that part is completely depleted of charge carriers if no voltage is applied at the control gate and a drain voltage is applied which is below the drain breakdown voltage ($BV_{DS}$). The drain breakdown voltage is that voltage at which the depletion zone at the junction between the LDD region and the well extends to the source region. The reduced charge carrier density of the LDD region however results in an increase in the resistance of the LDD region in the on condition and thus a reduction in the current flowing through the drain region. The on condition of the LDMOS transistor is the condition in which formed beneath the control gate is a channel which is enriched with the charge carriers as are present in the source and in the drain regions, being referred to as the inversion layer. The inversion layer is formed when a voltage, referred to as the gate voltage, of a given value which is characteristic in respect of the transistor, occurs at the control gate. The drain current, that is to say the current flowing through the drain region, is reduced by the increased resistance on the on condition. In addition the slight density of free charge carriers by virtue of the reduced charge carrier concentration in the LDD region leads to increased sensitivity in relation to static charges of the oxide or nitride layer over the LDD region.

The state of the art is to be found in applications DE 100 04 387, DE 100 63 135 and WO 01/75979. In a situation involving the use of a high-resistance semiconductor substrate, the previously known LDMOS constructions, including the improved construction described in the above-identified invention, suffer from the disadvantage of a capacitance, which is very low even with low drain voltages (for example Vg=0-0.1V), between the undepleted LDD zone at the surface of the drift space and the substrate, in particular in the weakly doped region between the well region determining the threshold voltage of the control gate, and the highly doped drain region. So that, in spite of that low capacitance in accordance with the above-specified applications in the off condition (with the gate voltage Vg=0) and a drain voltage markedly below the drain breakdown voltage $BV_{DS}$, total depletion of a part which is as large as possible of the drift space in respect of charge carriers and thus a low drain/gate capacitance and a drain breakdown voltage which is as high as possible with a field strength which is not excessively high at the thin gate insulator of the control gate are ensured, the number of free charge carriers in the LDD region and therewith also the conductivity in the 'on' condition must be suitably limited by a sufficiently low implantation dose in the LDD region. Besides the limited conductivity (high 'on' resistance Ron and poor current saturation performance), that low implantation dose also gives rise to an undesirably high level of sensitivity in respect of the LDMOS parameters (for example Ron, Ft and Fmax) in relation to static charges of the semiconductor surface, for example at a high drain voltage due to the injection of hot charge carriers from the LDD region into the electronic traps at the interface(s) of a passivation layer. In worst case scenarios such a charging effect can lead to a great reduction in or total pinch-off of the drain current at low drain voltages.

DISCLOSURE OF THE INVENTION

The object of the present invention is to provide an improved LDMOS transistor.

An aim of the present invention is also to increase the conductivity of the LDD region with low drain voltages by increasing the implantation dose and thus improving Ron, the saturation performance of the drain current and the high frequency properties of the LDMOS transistors without reducing the drain breakdown voltage.

A further aim of the invention is to reduce the instabilities of Ron and other LDMOS parameters coupled to Ron due to charging or recharging of traps at the surface of the drift space as a consequence of an injection of hot charge carriers or other effects.

A further object of the present invention is to provide a simple process for the production of an improved LDMOS transistor.

Those objects are attained by an LDMOS transistor according to one or another aspect of the invention and a process according to one or another aspect of the invention.

The above-indicated objects are attained by the introduction of an LDD double implantation in which, besides the implantation of an LDD region of the conductivity type of the highly doped S/D regions (in FIG. 1 referred to as n-implantation 1 and 2), in addition a second shallower ion implantation is effected with a lower level of dose than the first of opposite conductivity type (in FIG. 1 referred to as p-implantation). The dose and energy of that additional implantation are so matched to the first LDD implantation of the conductivity type of the S/D regions 3, 5 that, with a drain voltage which is markedly lower than the mean operating voltage of the LDMOS transistor, the second shallower implantation layer together with the part, which adjoins the gate and which is over the well region 7, of the LDD region 22, 26 of the conductivity type of the S/D regions 3, 5, is substantially depleted of free charge carriers. In that way the residual conductivity of the second shallower implantation layer can be disregarded, in regard to the high frequency properties. Accordingly relevant displacement currents occur at the working point of the LDMOS transistor in the LDD region only between the charge carriers carrying the drain current and the substrate 13 or in relation to the well region 7 which determines the threshold voltage of the transistor and which overlaps the drift space. With correct dimensioning of the additional implantation according to the invention therefore, neither the drain/gate capacitance nor the drain/substrate capacitance are increased at the working point. On the other hand the above-indicated additional implantation permits an increase in the implantation dose and thus the conductivity of the LDD region 22, 26 when Vd=0V, without an increase in the drain voltage required for total depletion thereof. That results in a reduction in Ron and an improvement in the limit frequency Ft.

A further substantial advantage of the additional implantation according to the invention is the production of a potential barrier in relation to hot charge carriers between the charge carrier channel in the LDD region 22, 26 and the semiconductor surface thereover. As a result the charge carriers which are heated in the drift field lose kinetic energy (1-2 eV) corresponding to the height of the barrier and only a small proportion thereof can still pass into the conduction band of the passivation oxide by way of the drift space, which improves the short-term and long-term stability of the LDMOS transistors.

In order to remove the charge carriers of the type of the inversion zone, which are produced in operation of the RFLDMOST by thermal generation or by charge carrier multiplication, from the inversion zone to the well region 7 or to the substrate 13, it may be desirable, particularly with a relatively high level of nett doping of the inversion zone 24, for same to be cut out at the gate edge in the edge region of the drift space 20. That obviates a possible instability of the surface potential by a variation in the charge carrier concentration in the inversion layer.

The provision of a cover layer of opposite conductivity type to that of the subjacent LDD region provides that doping of the LDD region can be increased without the depletion of the charge carriers in the region of the junction between the weakly doped LDD region and the well being substantially adversely affected. In addition the cover layer represents a potential barrier for hot charge carriers, which counteracts static charging of the insulator layer due to injected hot charge carriers.

With the two additional implantation a first additional implantation step in which a first LDD region or a second LDD region is produced, and a second additional implantation steps in which either the cover layer is produced or the cover layer and the first LDD region are produced the process for the production of the LDMOS transistor according to the invention can be integrated into a standard CMOS process.

An embodiment of the invention will now be described in detail with reference to the accompanying drawing.

BRIEF DESCRIPTION OF THE DRAWINGS

Besides being set forth in the claims, the features of the invention are also set forth in the description and the drawing, in which respect the individual features each in themselves or in pluralities in the form of sub-combinations represent patentable configurations in respect of which protection is claimed here. Embodiments of the invention are illustrated in the drawing and are described in greater detail hereinafter. The accompanying drawing is a view in vertical section of a transistor according to the invention.

DETAILED DESCRIPTION OF THE INVENTION

As shown in the drawings, an LDMOS transistor 1 according to the invention is provided so that between an n$^+$-doped source region 3 and an also n$^+$-doped drain region 5 is a p$^+$-doped region which is part of a p$^+$-doped well 7, referred to for brevity as the p$^+$-well. Disposed above the p$^+$-doped region is a control gate 9 which is separated from the p$^+$-doped region by an oxide layer, the gate oxide 11. The entire LDMOS transistor is formed in a p$^-$-doped epitaxial silicon layer 13 over a high-resistance substrate and laterally delimited by oxide-filled trenches, so-called trench insulations 15. The present case involves shallow trench insulations, referred to as shallow trenches.

The designations n-doped and p-doped signify that the charge carriers are electrons and holes respectively. Two different conductivity types exist in the semiconductor. Materials with electrons as the charge carriers are referred to as n-conducting while those with holes as the charge carriers are referred to as p-conducting. In silicon (Si) both kinds of charge carriers are present in the same concentration. The charge carrier concentration can be increased by the introduction of impurity atoms, so-called dopants. That procedure is referred to as doping. The situation involves n-doping if the introduced dopant is an n-dopant (donor), that is to say one which leads to an increase in the concentration of electrons as the charge carriers. The material is then n-conducting or n-doped. Phosphorus (P), arsenic (As) and antimony (Sb) are used as an n-dopant. On the other hand, p-doping occurs if the introduced dopant is a p-dopant (acceptor), that is to say one which leads to an increase in the concentration of holes as charge carriers. The material is then p-conducting or p-doped. Boron (B) is used as a p-dopant. If the increase in the concentration of electrons/holes after the doping operation is very great or very slight, that involves a highly doped (n$^+$/p$^+$-doped) material and a weakly doped (n-/p$^-$-doped) material respectively.

For contacting the source region 3, the drain region 5 and the control gate 9, a respective silicide layer 17 is deposited over those regions and the control gate 9 respectively, the layer 17 being connected to an external terminal 19 by way of a contact hole filled with metal 18 in an insulating layer (not shown). The suicide layer 17, the contact hole filled with metal 18 and the external terminal 19, which represent the contacts for the source region 3, are also provided as a contact for the p-well 7. The p-well 7 however is not in direct contact with the silicide layer 17 but only by way of a p$^+$-doped connecting region 8.

What is typical of an LDMOS transistor is the drift zone 20 which extends from the drain region 5 to the edge of the control gate 9. In the illustrated embodiment a part of the p$^+$-well 7 overlaps the drift zone 20.

A first, weakly n-doped drain region or LDD region 22, LDD standing for low doped drain, is formed in the drift zone 20. The first LDD region 22 extends from the n$^+$-doped drain region 5 to the edge of the drain-side gate spacer 10, and therefore it does not entirely reach the edge of the control gate 9 (gate edge). Its depth is less than that of the drain region 5. In accordance with the invention disposed over the first LDD region 22 is a shallow, highly p-doped (p$^+$-doped) cover layer 24 with a dopant concentration of $1\times10^{18}$ cm$^{-3}$. The dopant concentration in the cover layer 24, related to surface area, is however at a maximum $8\times10^{12}$ cm$^{-2}$ preferably $2\times10^{12}$ cm$^{-2}$. With the cover layer 24, the dopant concentration of the first LDD region 22 can be increased in relation to that in the known LDMOS transistors. The dopant concentration in the first LDD region 22, related to surface area, does not however exceed $1\times10^{13}$ cm$^{-2}$.

In the illustrated embodiment, also formed adjoining the gate edge over the first LDD region 22 is a second LDD region 26 which is somewhat more highly n-doped in relation to the first LDD region 22. Therefore, with its gate-side end, the second LDD region 26 projects beyond the first LDD region 22 by the width of the gate spacer 10. As only the second LDD region 26 extends as far as the gate edge, it represents the drain end at the gate side. The second LDD region 26 extends in a lateral direction from the gate edge towards the drain region 5 a little beyond the region of the p-well 7. Where the second LDD region 26 is to be found, it replaces the p-doped cover layer 24. That cover layer 24 therefore extends laterally between the drain region 5 and the second LDD region 26. The surface area-related concentration of n-dopant in the second LDD region 26 is lower than that of the p$^+$-well, it is at a maximum $5\times10^{13}$ cm$^{-2}$.

The second LDD region 26 is not a necessary feature of the invention, it can also be omitted. In that case however the first LDD region 22 does not extend only as far as the edge of the gate spacer 10 but as far as the gate edge. The first LDD region 22 then represents the drain end at the gate side. In addition the p-doped cover layer 24 then extends from the drain region 5 to the edge of the gate spacer 10, that is to say over the entire first LDD region.

The surface area-related dopant concentration, which is lower than the p$^+$-well, of the first LDD region 22 and optionally the second LDD region 26 provides that the depletion zone at the pn-junction between the p-well 7 and the first LDD region 22 and the second LDD region 26 respectively extends further into the first LDD region 22 than into the p-well 7 if no voltage is applied at the control gate and a voltage which is smaller than the drain breakdown voltage $BV_{DS}$ is applied at the drain region 5. In that case the dopant concentration of the first LDD region 22 is so selected that the latter, at least in its overlap region with the p$_+$-well 7, is completely depleted in respect of charge carriers. As a result the drain voltage falls over a relatively long distance so that the potential is reduced in the proximity of the end towards the gate of the first LDD region 22. The same applies in respect of the second LDD region 26.

The cover layer 24 according to the invention promotes expansion of the depletion zone into the first LDD region 22 and thus permits surface area-related doping of the first LDD region 22, which is increased in comparison with the known LDMOS transistors. Therefore, when the cover layer 24 is present, the conductivity of the first LDD region 22 can be increased without at the same time the potential at the gate end of the first LDD region 22 being increased. In addition the sensitivity of the first LDD region 22 to static charges of the insulating layer covering the drift zone 20 is reduced by the increased charge carrier concentration. At the same time the p-doped cover layer 24 represents a potential barrier for high-energy electrons (hot charge carriers) in the first LDD region 22, whereby the penetration of the high-energy electrons into the insulating layer and thus static charging thereof is suppressed.

The effects of the cover layer 24 depend on its depth and its dopant concentration. Preferably the depth and the dopant concentration in the cover layer 24 are so selected that, with the highest possible conductivity, at least in the region in which it overlaps with the p-well 7, the first LDD region 22 is already completely depleted in respect of charge carriers at a drain voltage of between 2 and 2.5 volts.

The described embodiment represents an n-channel transistor. In such a transistor, if a positive voltage exceeding a given value is applied to the control gate 9, the holes as charge carriers in the p-well 7 are urged away from the gate end of the p-well 7. At the same time the positive voltage attracts electrons from the source region 3 and the drain region 5 (in the LDMOS transistor from the LDD region or the LDD regions) into the p-well, whereby an excess of electrons as charge carriers is locally produced beneath the control gate 9, being the so-called n-channel, also referred to as the inversion layer. A p-channel transistor operates on the basis of the same principle but electrons and holes are interchanged as the charge carriers. It follows from this that the dopings in the p-channel transistor are opposite to those in an n-channel transistor. Having regard to the opposite doping, the invention described in the specific embodiment can also be applied to a p-channel transistor.

Described hereinafter is a production process for the n-channel LDMOS transistor 1 according to the invention, in which respect only those process steps which serve to produce the n-channel LDMOS transistor will be described in detail here.

In the first step an epitaxial, p$^-$-doped layer 13 is deposited on a high-resistance silicon substrate. Thereafter, in a conventional CMOS process step (CMOS stands for complementary metal oxide semiconductor and means that an n-channel transistor and a p-channel transistor are produced in a common substrate), the trenches for the trench insulations 18 are selectively etched and then the trenches are filled with oxide in order to delimit the active regions of the various transistors relative to each other.

In the next, also conventional step, a nitride mask is deposited on a part of the active region of the LDMOS transistor 1. The mask almost completely covers the region provided for the drift zone 20. Only that part which adjoins the control gate 9 that is still to be formed, remains unmasked. Thereafter boron or BF$_2$ is ion-implanted into the p$^-$-doped epitaxial layer 13 so that the p-well 7 is formed in the unmasked region. The p-well 7 therefore extends a little into the drift zone 20.

Then, without a mask, the gate oxide 11 is deposited on the entire surface of the active region of the LDMOS transistor. Thereafter, a polycrystalline or amorphous silicon layer is deposited over the gate oxide 11, the silicon layer then being etched using a mask, so that the control gate 9 remains behind on the oxide layer 11. This is also a standard CMOS step.

In the next step which is additional to the standard CMOS process, a nitride mask is applied, which leaves uncovered that part of the drift zone 20 in which the p-well 7 is formed and a small part of the drift zone 20, which part adjoins the p-well 7. An ion implantation operation with phosphorus is then carried out in order to produce the shallow second LDD region 26. The implantation dose is at most $5\times10^{13}$ cm$^{-2}$, preferably $1\times10^{13}$ cm$^{-2}$.

After the implantation of phosphorus the nitride mask is removed and the gate spacers 10 of nitride are deposited in the usual manner at the side walls of the control gate 9. The gate oxide 11 is then etched away so that it only remains under the control gate and the gate spacers 10.

Then in a standard CMOS step a fresh nitride mask is deposited, which leaves uncovered the regions in which the source and the drain are to be formed. The source region 3 and the drain region 5 are then formed by means of an ion implantation operation using phosphorus.

Thereafter the nitride mask is removed and a new conventional nitride mask is applied, which leaves uncovered that region in which the connecting region 8 for the p-well 7 is to be produced. The connecting region 8 for the p-well 7 is formed by means of an ion implantation operation using boron or BF$_2$, in the unmasked portion of the active region of the LDMOS transistor.

After removal of the mask the procedure then involves an ion implantation operation which is additional to the standard CMOS process, involving phosphorus, without masking, in order to form the first LDD region 22. In that case the implantation dose is at most $1\times10^{13}$ cm$^{-2}$, preferably $5\times10^{12}$ cm$^{-2}$. That is followed by a further unmasked ion implantation operation, this time using boron or BF$_2$, to form the cover layer 24. The implantation dose is at most $8\times10^{12}$ cm$^{-2}$, preferably $2\times10^{12}$ cm$^{-2}$.

If an LDMOS transistor without a second LDD region 26 is to be formed, implantation of the first LDD region 22 is effected prior to the formation of the gate spacers 10 so that the first LDD region 22 extends as far as the gate edge.

Preferably the energy and the dose of the implantation operation for the cover layer 24 are so selected that, with the highest possible conductivity, at least in the region in which it overlaps with the p-well 7, the first LDD region 22 is already completely depleted in respect of charge carriers at a drain voltage of between 2 and 2.5 volts.

The next step involves implementing in the usual manner silication of the surfaces of the source region 3, the drain region 5, the connecting region 8 and the control gate 9. Silication is effected using conventional silicide blockers, for example a structured nitride layer, to prevent the formation of silicide on the surface portions on which no silication is to occur.

Finally the LDMOS transistor is finished using conventional CMOS process steps which include the formation of a thick oxide layer, etching of contact holes, filling the contact holes with metal and the deposit of conductor tracks.

The invention claimed is:

1. An LDMOS transistor comprising a source region (3), a drain region (5), a control gate (9) and a drift zone (20) extending between the drain region (5) and the control gate (9), wherein formed in the drift zone (20) is a first LDD region (22) of the same conductivity type as that of the drain region (5), characterised in that a cover layer (24) is provided over the first LDD region (22) and that the cover layer (24) is of the conductivity type opposite to the conductivity type of the first LDD region (22), and in that a second LDD region (26) more highly doped in relation to the first LDD region (24) is disposed at the gate end of the first LDD region (22), and compensates at least partially the doping of the cover layer (24).

2. An LDMOS transistor as set forth in claim 1 characterised in that the surface area-related dopant concentration in the first LDD layer (22) does not exceed a value of $1\times10^{13}$ cm$^{-2}$ and the surface area-related dopant concentration in the cover layer (24) does not exceed a value of $5\times10^{12}$ cm$^{-2}$.

3. An LDMOS transistor as set forth in claim 1 characterised in that there is provided a highly doped p-well (7) which extends under the source region (3), under the control gate (9) and under a part of the first LDD region (22).

4. An LDMOS transistor as set forth in claim 3 characterised in that the p-well (7) overlaps with the largest part of that portion of the first LDD region (22), in which the second LDD region (26) is formed.

5. An LDMOS transistor as set forth in claim 3 characterised in that the dopant concentrations in the first LDD region (22), in the layer (24) and optionally in the second LDD region (26) are so selected that the first LDD region (22) and optionally the second LDD region (26) are completely depleted in respect of charge carriers at least in the region of the overlap with the p-well (7) if no voltage is applied to the control gate (9) and a drain voltage is applied which is less than the breakdown voltage $BV_{DS}$ of the drain region (5).

6. An LDD transistor as set forth in claim 5 characterised in that the first LDD region (22) and optionally the second LDD region (26) is completely depleted in respect of charge carriers at least in the region of the overlap with the p-well (7) if no voltage is applied to the control gate and a drain voltage of 2 volts is applied.

7. A lateral CMOS-compatible RF-DMOS transistor (RFLDMOST) with low 'on' resistance, characterised in that disposed in the region of the drift space (20) which is between the highly doped drain region (5) and the control gate (9) and above the low doped drain region LDDR (22, 26) of the transistor is a doping zone (24) which is shallow in comparison with the penetration depth of the source/drain region (3, 5), of inverted conductivity type to the LDDR (22, 26) (hereinafter referred to as the inversion zone) which has a surface area-related net doping which is lower than the net doping of the LDDR (22, 26) and does not exceed a net doping of 8E12 At/cm2, and in that the LDDR comprises a first, more highly doped region (26) directly adjoining the control gate and a second, preferably more weakly doped region (22) which directly adjoins the highly doped drain region (5), wherein the first region is arranged over a doping zone (7) of opposite conductivity type (well region) which is disposed under the control gate (9) and which extends into the drift space (20) and which influences the threshold voltage and the short channel behaviour of the transistor and in which the net doping concentration is markedly higher than in the region of the highly doped drain region (5), and wherein said first region overlaps the well region by a distance which is small in comparison with the length of the drift region (20) in the direction of the highly doped drain region (5).

8. An RFLDMOST with low 'on' resistance as set forth in claim 7 characterised in that the LDDR (22, 26) is cut out in one or more edge regions of the drift space (20), adjoining the control gate (9) and the lateral insulation.

9. An LDMOS transistor comprising a source region (3), a drain region (5), a control gate (9) and a drift zone (20) extending between the drain region (5) and the control gate (9), wherein formed in the drift zone (20) is a first LDD region (22) of the same conductivity type as that of the drain region (5), characterised in that a cover layer (24) is provided over the first LDD region (22) and that the cover layer (24) is of the conductivity type opposite to the conductivity type of the first LDD region (22), and in that there is provided a highly doped p-well (7) which extends under the source region (3), under the control gate (9) and under a part of the first LDD region (22), and further characterised in that the surface area-related dopant concentration in the first LDD layer (22) does not exceed a value of $1\times10^{13}$ cm$^2$ and the surface area-related dopant concentration in the cover layer (24) does not exceed a value of $5\times10^{12}$ cm$^{-2}$.

10. An LDMOS transistor comprising a source region (3), a drain region (5), a control gate (9) and a drift zone (20) extending between the drain region (5) and the control gate (9), wherein formed in the drift zone (20) is a first LDD region (22) of the same conductivity type as that of the drain region (5), characterised in that a cover layer (24) is provided over the first LDD region (22) and that the cover layer (24) is of the conductivity type opposite to the conductivity type of the first LDD region (22), and in that there is provided a highly doped p-well (7) which extends under the source region (3), under the control gate (9) and under a part of the first LDD region (22), and further characterised in that the p-well (7) overlaps with the largest part of that portion of the first LDD region (22), in which the second LDD region (26) is formed.

11. An LDMOS transistor comprising a source region (3), a drain region (5), a control gate (9) and a drift zone (20) extending between the drain region (5) and the control gate (9), wherein formed in the drift zone (20) is a first LDD region (22) of the same conductivity type as that of the drain region (5), characterised in that a cover layer (24) is provided over the first LDD region (22) and that the cover layer (24) is of the conductivity type opposite to the conductivity type of the first LDD region (22), and in that there is provided a highly doped p-well (7) which extends under the source region (3), under the control gate (9) and under a part of the first LDD region (22),and further characterised in that the dopant concentrations in the first LDD region (22), in the layer (24) and optionally in the second LDD region (26) are so selected that the first LDD region (22) and optionally the second LDD region (26) are completely depleted in respect of charge carriers at least in the region of the overlap with the p-well (7) if no voltage is applied to the control gate (9) and a drain voltage is applied which is less than the breakdown voltage $BV_{DS}$ of the drain region (5).

12. An LDD transistor as set forth in claim 11 characterised in that the first LDD region (22) and optionally the second LDD region (26) is completely depleted in respect of charge carriers at least in the region of the overlap with the p-well (7) if no voltage is applied to the control gate and a drain voltage of 2 volts is applied.

13. A lateral CMOS-compatible RF-DMOS transistor (RFLDMOST) with low 'on' resistance, characterised in that disposed in the region of the drift space (20) which is between the highly doped drain region (5) and the control gate (9) and above the low doped drain region LDDR (22, 26) of the transistor is a doping zone (24) which is shallow in comparison with the penetration depth of the source/drain region (3, 5), of inverted conductivity type to the LDDR (22, 26) (hereinafter referred to as the inversion zone) which has a surface area-related net doping which is lower than the net doping of the LDDR (22, 26) and does not exceed a net doping of 8E12 At/cm2, and in that the LDDR (22, 26) is cut out in one or more edge regions of the drift space (20), adjoining the control gate (9) and the lateral insulation.

* * * * *

UNITED STATES PATENT AND TRADEMARK OFFICE
CERTIFICATE OF CORRECTION

PATENT NO. : 7,304,348 B2  
APPLICATION NO. : 10/487174  
DATED : December 4, 2007  
INVENTOR(S) : Ehwald et al.

It is certified that error appears in the above-identified patent and that said Letters Patent is hereby corrected as shown below:

1. In column 1, line 20, "LD-MOS" should be --LDMOS--.

2. In column 4, line 49, after "implantation", --steps-- should be inserted.

3. In column 4, line 52, "steps" should be --step--.

4. In column 4, line 53, after "produced", --hyphen-- should be inserted.

5. In column 5, line 8, "drawings" should be --drawing--.

6. In column 5, line 48, "suicide" should be --silicide--.

7. In column 6, line 44, "$P_+$" should be --$P^+$--.

8. In column 9, line 60, claim 9, line 14, "$cm^2$" should be --$cm^{-2}$--.

Signed and Sealed this

Twentieth Day of May, 2008

JON W. DUDAS  
*Director of the United States Patent and Trademark Office*